(12) United States Patent
Miyabe et al.

(10) Patent No.: US 6,429,695 B1
(45) Date of Patent: Aug. 6, 2002

(54) DIFFERENTIAL COMPARISON CIRCUIT

(75) Inventors: Satoru Miyabe, Tokyo; Yasuhiro Sugimoto, Kanagawa-ken, both of (JP)

(73) Assignees: Nippon Precision Circuits Inc., Tokyo; Yasuhiro Sugimoto, Kanagawa-ken (JP)

( * ) Notice: Subject to any disclaimer, the term of this patent is extended or adjusted under 35 U.S.C. 154(b) by 0 days.

(21) Appl. No.: 09/992,335

(22) Filed: Nov. 6, 2001

(30) Foreign Application Priority Data

Nov. 24, 2000 (JP) ........................................ 2000-357700

(51) Int. Cl.[7] .............................. G11C 7/06; H03K 5/22
(52) U.S. Cl. ........................................... 327/57; 327/71
(58) Field of Search .............................. 327/50, 51, 52, 327/54, 55, 57, 65, 67, 71, 77, 87, 89, 560–562; 330/252, 253

(56) References Cited

U.S. PATENT DOCUMENTS

| | | | | |
|---|---|---|---|---|
| 4,816,706 A | * | 3/1989 | Dhong et al. .................. | 327/57 |
| 5,874,840 A | * | 2/1999 | Bonaccio ...................... | 327/51 |
| 5,903,171 A | * | 5/1999 | Shieh ........................... | 327/55 |
| 6,002,270 A | * | 12/1999 | Timoc .......................... | 327/57 |
| 6,191,624 B1 | * | 2/2001 | Matsuya ....................... | 327/55 |
| 6,292,030 B1 | * | 9/2001 | Shih ............................. | 327/55 |

* cited by examiner

Primary Examiner—Toan Tran
(74) Attorney, Agent, or Firm—Jordan and Hamburg LLP

(57) ABSTRACT

A differential comparison circuit capable of easily obtaining desired circuit accuracy and comparing differential signals with reduced influences of fluctuation of a power source voltage. Input/output terminals I/O1 and I/O2 of a latch circuit 1 are connected to the drain terminals of MOS transistors M1 and M2 having the same characteristics. Input terminals IN1 and IN2 are provided to the gate and source terminals of the MOS transistor M2, and input terminals IN3 and IN4 are provided to the gate and source terminals of the MOS transistor M2. A bias circuit 2 brings the MOS transistors M1 and M2 into the same bias state. The difference of the input signals supplied to the input terminals IN1 and IN2 is compared with the difference of the input signals supplied to the input terminals IN3 and IN4. Since the comparison result is outputted from the first and second input/output terminals I/O1 and I/O2, the input offset voltage does not affect the differential comparison circuit. Therefore, the differential comparison circuit can set the reference voltage to the differential signal and can easily obtain required accuracy.

5 Claims, 4 Drawing Sheets

DIFFERENTIAL COMPARISON CIRCUIT

BACKGROUND OF THE INVENTION

1. Field of the Invention

This invention relates to a differential comparison circuit for comparing differential signals.

2. Description of the Related Art

A comparison circuit for comparing differential signals has been used at present for a pipeline system A/D converter, for example. This pipeline system A/D converter is constituted by cascading a plurality of sample-and-hold circuits and acquires each bit value of the least significant bit (LSB) from the most significant bit (MSB) of pulse code modulation (PCM) data from comparison circuits arranged at their junctions. More concretely, the pipeline system A/D converter has the construction shown in FIG. 4. A sample-and-hold circuit SH is composed of a completely differential type operational amplifier 41, and a plurality of these circuits SH is cascaded. In other words, output terminals out1 and out2 of a sample-and-hold circuit SH of a preceding stage are connected to input terminals in1 and in2 of a sample-and-hold circuit SH of a subsequent stage. The completely differential type operational amplifier 41 generates the differential signals from the output terminals out1 and out 2. These signals are output signals Vout1 and Vout2 that are the analog signals inverted mutually with a voltage equilibrium point V1 of both output terminals as the center as shown in FIG. 5. The voltage equilibrium point V1 is accomplished by arranging feedback circuits having the same phase, not shown in the drawing, at the output terminals out1 and out2 and by adjusting the output bias of the completely differential type operational amplifier 41.

Each comparison circuit 42 is disposed at the junction between the sample-and-hold circuit SH of a preceding stage and the sample-and-hold circuit SH of a subsequent stage. A comparator 52 of the comparison circuit 42 compares the output voltage of the sample-and-hold circuit SH of the preceding stage with a predetermined reference voltage equal to the voltage equilibrium point V1, or the voltages at output terminals out1 and out2 of the sample-and-hold circuit of the preceding stage with each other, to thereby judge "1" and "0" and outputs the result from the output terminal CO. When this judgment value is "1", the sample-and-hold circuit SH of the subsequent stage outputs the voltage value that is twice the difference obtained by subtracting the voltage value corresponding to the judgment value "1" from the output voltage of the sample-and-hold circuit SH of the preceding stage. When the judgment value is "0", the sample-and-hold circuit SH of the subsequent stage outputs the voltage value that is twice the difference obtained by subtracting the voltage value corresponding to the judgment value "0" from the output voltage of the sample-and-hold circuit SH of the preceding stage. Such a sample-and-hold operation is conducted as switching of a plurality of capacitances, not shown, connected to switch capacitance networks CS1 and CS2 and reset switches RS1 and RS2 interposed between the output terminals out1 and out2 and the input terminals in1 and in2 of the sample-and-hold circuit SH is effected. When such comparison operation and sample-and-hold operation are conducted, the analog signals are applied to the sample-and-hold circuit SH of the initial stage, and the comparison circuits 42 from the initial to last stages output each bit value of LSB from MSB of the PCM data, respectively. Each comparison circuit 42 includes an input amplitude monitor unit for monitoring whether or not the input signal of the sample-and-hold circuit SH is within a suitable allowable input range, in addition to a comparator 52 for conducting the comparison operation described above. The sample-and-hold circuit SH transmits therein the analog signals to the input terminals in1 and in2 through the switch capacitance networks CS1 and CS2 to the differential input terminals of the completely differential type operational amplifier 41. Therefore, the suitable input range is determined by the differential amplitude rather than by the absolute value. The prior art technology expresses the predetermined amplitude value by use of the absolute value of the reference voltage as will be explained below.

In the comparison circuit 42, the input amplitude monitor unit comprises comparators 43, 44, 47 and 48, inverters 45 and 49, AND gates 46 and 50 and an OR gate 51. The comparator 43 compares the output signal Vout1 with the reference voltage Vref1 (=1.5 V). The comparator 44 compares the output signal Vout2 with the reference voltage Vref2 (=0.5 V). The comparator 47 compares the output signal Vout1 with the reference voltage Vref2. The comparator 48 compares the output signal Vout2 with the reference voltage Vref1. The output from the comparator 43 is given to one of the terminals of the AND gate 46. The output from the comparator 44 is given to the other terminal of the AND gate 46 through the inverter 45. When the output signals Vout1 and Vout2 are above 1.5 V and below 0.5 V, respectively, the comparator 43 outputs the logic level "1", the comparator 44 outputs the logic level "0" and the AND gate 46 outputs the logic level "1". Similarly, when the output signals Vout1 and Vout2 are below 0.5 V and above 1.5 V, respectively, the AND gate 50 outputs the logic level "1". Therefore, the OR gate 51 in this embodiment output the logic level "1" notifying the excess of the allowable input range from the output terminal OVER when the amplitude difference between the output signals Vout1 and Vout2 is greater than 1 V.

However, the comparison circuit 42 shown in FIG. 4 cannot make the most of the advantage of the differential signals created by the output signals Vout1 and Vout2. For example, fluctuation of the power source voltage and of the voltage equilibrium point V1 does not greatly affect the difference of the amplitude values of the output signals Vout1 and Vout2, but the output signals Vout1 and Vout2 per se are greatly affected by such fluctuation. Since the comparison circuit 42 compares these output signals Vout1 and Vout2 as the discrete voltages with the predetermined reference voltages Vref1 and Vref2, the comparison result is likely to be affected by the fluctuation of the power source voltage and the voltage equilibrium point V1. When the voltage equilibrium point v1 shown in FIG.5 shifts up or down, for example, the erroneous operation develops in any of the comparators 43, 44, 47 and 48.

SUMMARY OF THE INVENTION

It is therefore an object of the present invention to provide a differential comparison circuit capable of easily acquiring desired circuit accuracy and capable of comparing differential signals with smaller influences of fluctuation of a power source voltage and a voltage equilibrium point.

A differential comparison circuit according to the present invention comprises a first MOS transistor using its gate terminal as a first input terminal and its source terminal as a second input terminal; a second MOS transistor having the same conduction type as that of the first MOS transistor, and using its gate terminal as a third input terminal and its source terminal as a fourth input terminal; a latch circuit having its first input/output terminal connected to a drain terminal of the first MOS transistor and its second input/output terminal connected to a drain terminal of the second MOS transistor; and a bias circuit for bringing the first and second MOS transistor into the same bias condition; wherein the difference of the input signals supplied to the first and second input terminals is compared with the difference of the input signals supplied to the third and fourth input terminals, and a comparison result is outputted from the first and second input/output terminals.

Preferably, the bias circuit described above includes a first current source connected between the source terminal of the first MOS transistor and a first power source terminal, a second current source connected between the drain terminal of the first MOS transistor and a second power source terminal, a third current source connected between the source terminal of the second MOS transistor and the first power source terminal, and a fourth current source connected between the drain terminal of the second MOS transistor and the second power source terminal, and the first and second power source terminals have mutually opposite polarities.

Preferably, the bias circuit described above includes a common current source connected between the drain terminal and the power source terminal of each of the first and second MOS transistors.

Preferably, the bias circuit described above includes active loads of third and fourth MOS transistors interposed between the drain terminals of the first and second MOS transistors and the current sources, respectively, the third and fourth MOS transistors have an opposite conduction type to that of the first and second MOS transistors, the drain of each of the third and fourth MOS transistors is connected to the drain of each of the first and second MOS transistors, and the source of each of the third and fourth MOS transistors is connected to each of the current sources.

Preferably, the differential comparison circuit further comprises a first source follower interposed between the first input terminal and the gate terminal of the first MOS transistor, and having its input terminal connected to the first input terminal and its output terminal connected to the gate terminal of the first MOS transistor; a second source follower interposed between the second input terminal and the source terminal of the first MOS transistor, and having its input terminal connected to the second input terminal and its output terminal connected to the source terminal of the first MOS transistor; a third source follower interposed between the third input terminal and the gate terminal of the second MOS transistor, and having its input terminal connected to the third input terminal and its output terminal connected to the gate terminal of the second MOS transistor; and a fourth source follower interposed between the fourth input terminal and the source terminal of the second MOS transistor, and having its input terminal connected to the fourth input terminal and its output terminal connected to the source terminal of second MOS transistor.

DESCRIPTION OF THE PREFERRED EMBODIMENTS

Figure 1:
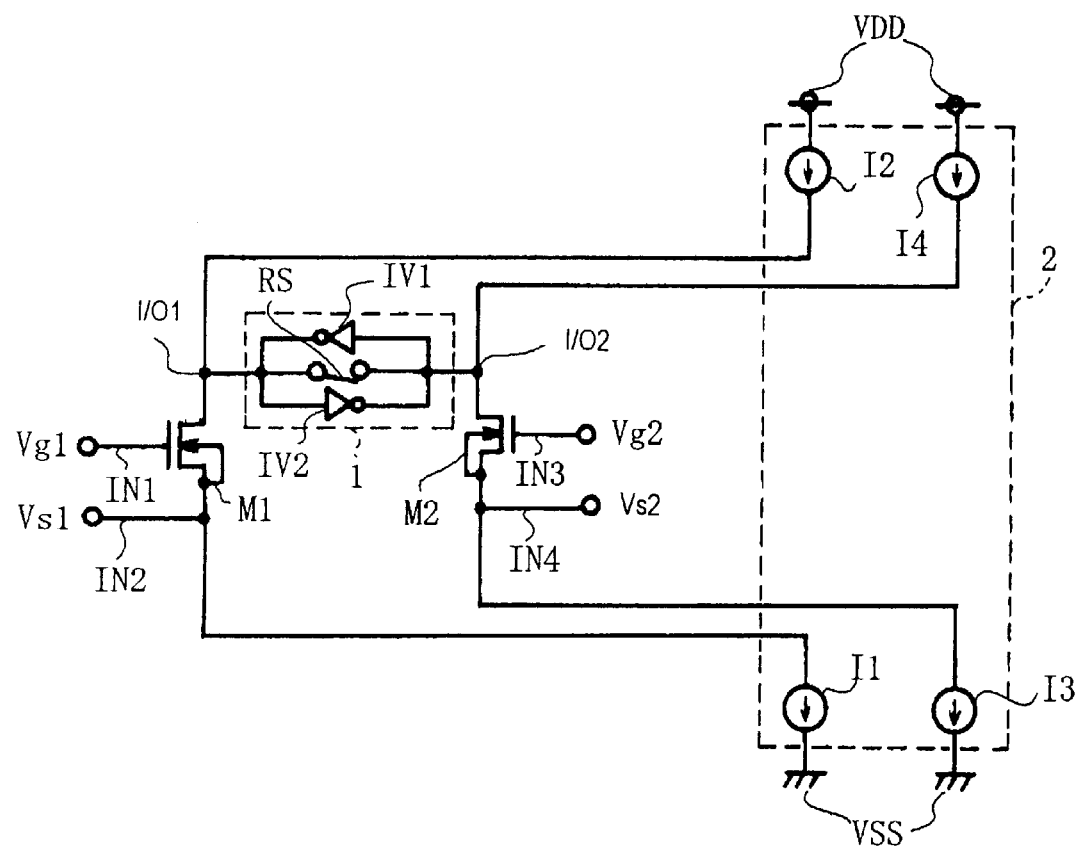
FIG. 1 is a circuit diagram showing a construction of a differential comparison circuit according to a first embodiment of the present invention.

Hereinafter, several preferred embodiments of the present invention will be explained in detail with reference to the accompanying drawings. FIG. 1 is a circuit diagram showing a construction of a differential comparison circuit according to a first embodiment.

First and second MOS transistors M1 and M2 are N channel MOS transistors that are fabricated into the same size to obtain the same characteristics. The first MOS transistor M1 has first and second input terminals IN1 and IN2 at its gate and source terminals, respectively. These input terminals IN1 and In2 receive input signals $Vg_1$ and $Vs_1$ that are differential signals relative to each other. The second MOS transistor M2 has third and fourth input terminals IN3 and IN4 at its gate and source terminals, respectively. These input terminals IN1 and IN2 receive input signals $Vg_2$ and $Vs_2$ that are differential signals to each other. The drain terminals of the first and second MOS transistors M1 and M2 are connected to first and second input/output terminals I/01 and I/02, respectively, and also to a bias circuit 2. The substrates of the first and second MOS transistors M1 and M2 are connected to their source terminals. The source terminals of the first and second MOS transistors M1 and M2 are connected to the bias circuit 2. The bias condition of the first and second MOS transistors M1 and M2 is the same.

A latch circuit 1 includes a pair of inverters IV1 and IV2 having input and output terminals connected to one another to provide the first and second input/output terminals I/01 and I/02, and a reset switch RS interposed between the input/output terminals 1/O1 and I/O2. A comparison result of a differential component as the difference between the input signals $Vg_1$ and $Vs_1$ with a differential component as the difference between the input signals $Vg_2$ and $Vs_2$ is outputted as logic levels from the first and second input/output terminals I/O1 and I/O2. When there sets witch RS is turned ON,the latched logic level is reset.

The bias circuit 2 includes first and second current sources I1 and I2 each having one of the terminals thereof connected to the source and drain terminals of the first MOS transistor M1, and third and fourth current sources I3 and I4 each having one of the ends thereof connected to the source and drain terminals of the second MOS transistor M2. The other terminal of each of the first and third current sources I1 and I3 is connected to a power source terminal VSS (0 V) and the other terminal of each of the second and fourth current sources I2 and I4 is connected to a power source terminal VDD (2 V).

Next, the operation of this embodiment will be explained.

The substrates of the first and second MOS transistors M1 and M2 and the source terminal remain always at the same potential, and the substrate bias effect does not exist. Therefore, the source-drain voltage of each of the first and second MOS transistors M1 and M2 decides the condition of each MOS transistor M1, M2. Assuming hereby that input signals having the same amplitude (Vg−Vs) but having different offset potentials are applied to the gate-source of the first and second MOS transistors, respectively, the conditions of the first and second MOS transistors M1 and M2 are equal to each other irrespective of the offset potentials.

In other words, the same phase component of the input signal $Vg_1$ and $Vs_1$ applied to the gate and the source of the first MOS transistor M1 is removed, and only the differential component is taken out as the signal. This also holds true of the second MOS transistor M2.

When the input values to the first and second MOS transistors M1 and M2 are different in relation to the differential components of the input signals $Vg_1$ and $Vs_1$ and the differential components of the input signals $Vg_2$ and $Vs_2$, the conditions of the first and second MOS transistors M1 and M2 are different, and the latch circuit 1 amplifies the difference of these differential components to the logic level and outputs the difference so amplified.

In the manner described above, this embodiment can compare and output the difference between the differential component for the first MOS transistor M1 and the differential component for the second MOS transistor M2. When, for example, the differential components of the input signals $Vg_2$ and $Vs_2$ are the reference voltages, only the differential component needs be fixed. Therefore, in comparison with the prior art technology in which the reference voltages Vref1 and Vref2 have the fixed values, this embodiment can obtain more easily the reference voltages having desired accuracy. In addition, even when the offset potentials of the input signals $Vg_1$ and $Vs_1$ fluctuate due to fluctuation of the power source voltage, etc, no influence is exerted on the differential components that are to be compared, and the differential signals can be compared with smaller influences of the fluctuation of the power source voltage, or the like.

Figure 2:
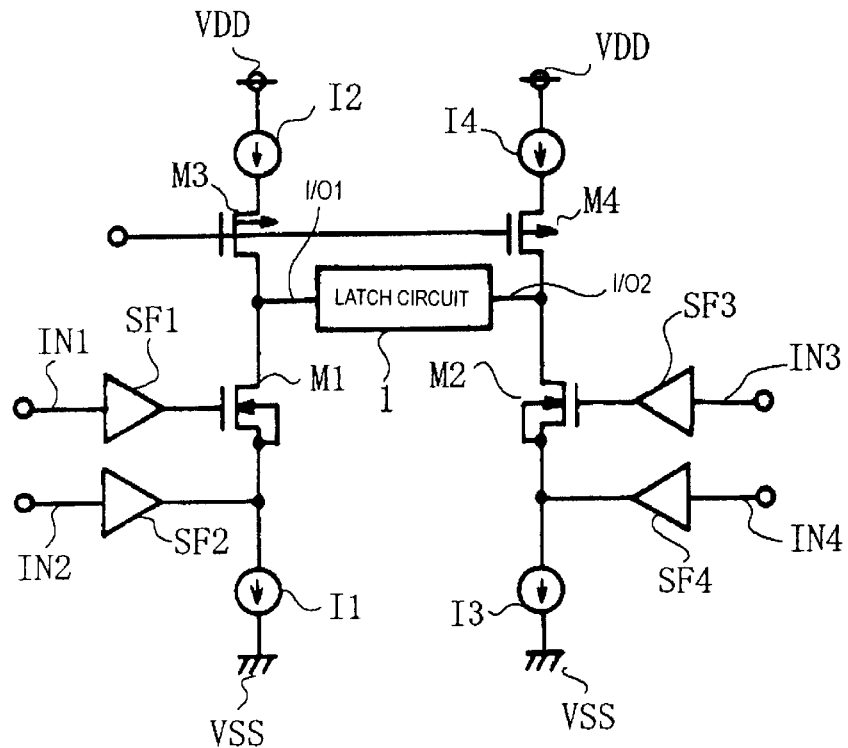
FIG. 2 is a circuit diagram showing a construction of a differential comparison circuit according to a second embodiment of the present invention.

Next, the second embodiment of the present invention will be explained. FIG.2 is a circuit diagram showing a construction of this embodiment, wherein like reference numerals are used to identify like constituent elements as those used in FIG. 1. This also holds true of the later-appearing drawings. In this embodiment, first to fourth source follower circuits SF1 to SF4 are interposed between the first to fourth input terminals IN1 to IN4 and the first and second MOS transistors M1 and M2, respectively, in order to prevent each differential input terminal of each of the first and second MOS transistors M1, M2, that is, a signal path of each gate-source terminal, from serving as a DC load to the signal source, and to shift the input signal to a suitable signal input level. The input terminal of each of the first to fourth source follower circuits SF1 to SF4 is connected to each of the first to fourth input terminals IN1 to IN4 and its output terminal is connected to each of the first and second MOS transistors M1 and M2.

A third MOS transistor M3 is interposed as an active load between the first MOS transistor M1 and the second current source I2. Similarly, a fourth MOS transistor M4 is interposed as the active load between the second MOS transistor M2 and the fourth current source I4. The third and fourth MOS transistors M3 and M4 are P channel MOS transistors that have a conduction type opposite to that of the first and second MOS transistors M1 and M2.

This embodiment having such a construction exhibits the same function and effect as in the first embodiment. In addition, since each differential input terminal, that is, the signal path to each gate terminal or each source terminal, does not operate as the DC load to the signal source, the operation speed can be improved and the input signal is allowed to shift to a suitable signal input level, thereby improving the input voltage range.

Figure 3:
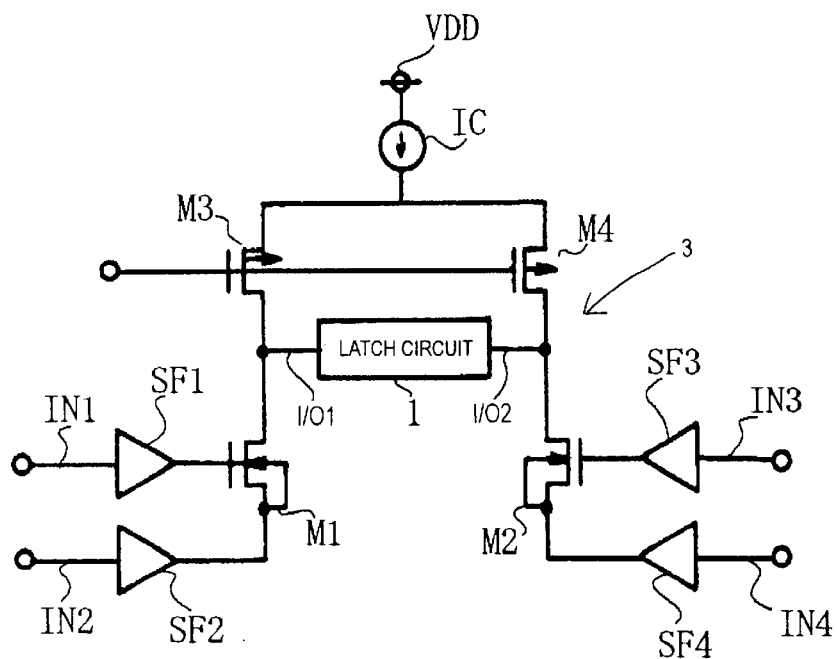
FIG. 3 is a circuit diagram showing a construction of a differential comparison circuit according to a third embodiment of the present invention.
Figure 4:
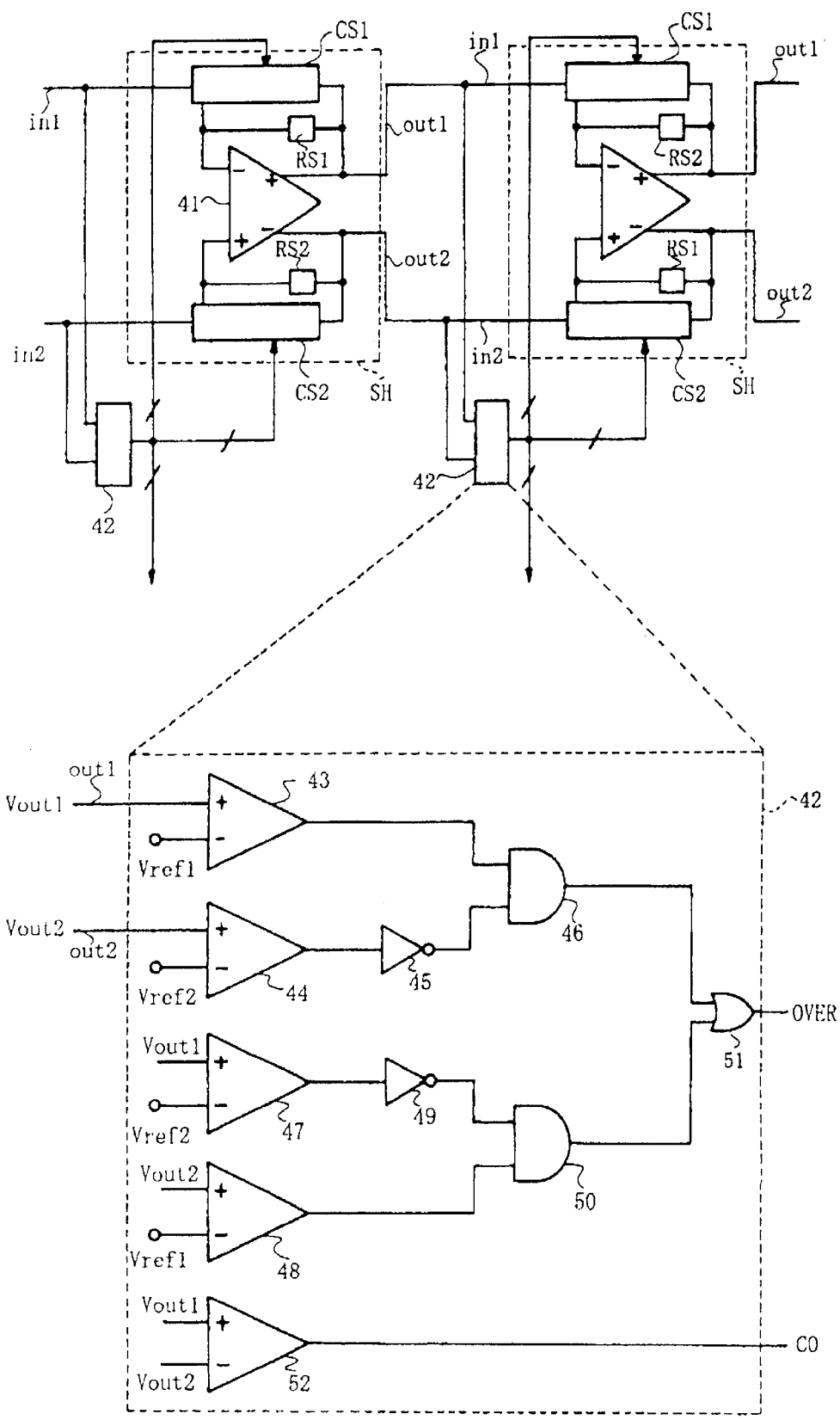
FIG. 4 is a circuit diagram showing a construction of a differential comparison circuit according to the prior art.
Figure 5:
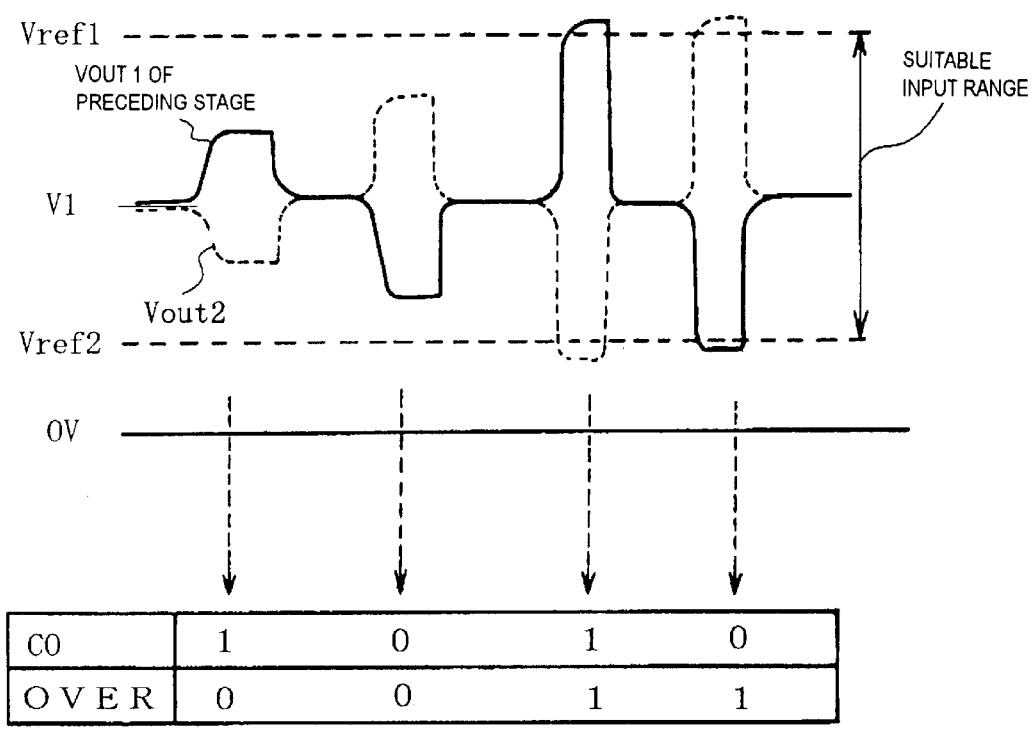
FIG. 5 is a waveform diagram useful for explaining an example of a differential signal.

Next, the third embodiment of the present invention will be explained. FIG. 3 is a circuit diagram showing a construction of this embodiment. As shown in the circuit diagram, the first to fourth current sources I1 to I4 are omitted but the third and fourth MOS transistors M3 and M4 are connected to a common current source IC to constitute the comparison output portion 3 into the differential construction. The comparison result of the differential components can be outputted as the differential signals from the first and second input/output terminals I/O1 and I/O2. This embodiment having such a construction exhibits the same function and effect as in the second embodiment, and can output the comparison result of the differential components as the differential signals.

The present invention can compare the differential component as the difference of two input signals with the differential component of other two input signals. The present invention can easily acquire a reference voltage having desired accuracy by using one of the differential components as the reference voltage and can highly precisely compare the differential components. In addition, even when the offset potential of each input signal fluctuates owing to the fluctuation of the power source voltage, or the like, no influence is exerted on each differential component to be compared. In other words, the present invention can compare the differential components with restrained influences of the fluctuation of the power source voltage, etc, and can therefore provide a differential comparison circuit capable of easily acquiring desired circuit accuracy with smaller influences of the power source voltage.

What is claimed is:

1. A differential comparison circuit comprising:

a first MOS transistor using a gate terminal thereof as a first input terminal and a source terminal thereof as a second input terminal;

a second MOS transistor having the same conduction type as that of said first MOS transistor, and using a gate terminal thereof as a third input terminal and a source terminal thereof as a fourth input terminal;

a latch circuit having a first input/output terminal thereof connected to a drain terminal of said first MOS transistor and a second input/output terminal thereof connected to a drain terminal of said second MOS transistor; and a bias circuit for bringing said first and second MOS transistor into the same bias condition;

wherein a difference of the input signals supplied to said first and second input terminals is compared with a difference of input signals supplied to said third and fourth input terminals, and a comparison result is outputted from said first and second input/output terminals.

2. A differential comparison circuit according to claim 1, wherein said bias circuit includes a first current source connected between the source terminal of said first MOS transistor and a first power source terminal, a second current source connected between the drain terminal of said first MOS transistor and a second power source terminal, a third current source connected between the source terminal of said second MOS transistor and said first power source terminal and a fourth current source connected between the drain terminal of said second MOS transistor and said second power source terminal, and said first and second power source terminals have mutually opposite polarities.

3. A differential comparison circuit according to claim 1, wherein said bias circuit includes a common current source connected between a power source and the drain terminal of each of said first and second MOS transistors.

4. A differential comparison circuit according to claim 2 or 3, wherein said bias circuit includes active loads of third and fourth MOS transistors interposed between the drain terminals of said first and second MOS transistors and said current sources, respectively, said third and fourth MOS transistors have an opposite conduction type to that of said first and second MOS transistors, the drain of each of said third and fourth MOS transistors is connected to the drain of each of said first and second MOS transistors, and the source of each of said third and fourth MOS transistors is connected to each of said current sources.

5. A differential comparison circuit according to claim 2 or 3, which further comprises:
   a first source follower interposed between said first input terminal and the gate terminal of said first MOS transistor, and having an input terminal thereof connected to said first input terminal and an output terminal thereof connected to the gate terminal of said first MOS transistor;
   a second source follower interposed between said second input terminal and the source terminal of said first MOS transistor, and having an input terminal thereof connected to said second input terminal and an output terminal thereof connected to the source terminal of said first MOS transistor;
   a third source follower interposed between said third input terminal and the gate terminal of said second MOS transistor, and having an input terminal thereof connected to said third input terminal and an output terminal thereof connected to the gate terminal of said second MOS transistor; and
   a fourth source follower interposed between said fourth input terminal and the source terminal of said second MOS transistor, and having an input terminal thereof connected to said fourth input terminal and an output terminal thereof connected to the source terminal of said second MOS transistor.

* * * * *